(12) United States Patent
Hwang et al.

(10) Patent No.: US 9,721,941 B2
(45) Date of Patent: Aug. 1, 2017

(54) SEMICONDUCTOR DEVICE IN A LEVEL SHIFTER WITH ELECTROSTATIC DISCHARGE (ESD) PROTECTION CIRCUIT AND SEMICONDUCTOR CHIP

(71) Applicant: Magnachip Semiconductor, Ltd., Cheongju-si (KR)

(72) Inventors: Kyong Jin Hwang, Cheongju-si (KR); Hyun Kwang Jeong, Seoul (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 7 days.

(21) Appl. No.: 14/803,976

(22) Filed: Jul. 20, 2015

(65) Prior Publication Data

US 2016/0268251 A1    Sep. 15, 2016

(30) Foreign Application Priority Data

Mar. 13, 2015  (KR) .................. 10-2015-0034921

(51) Int. Cl.
| | | |
|---|---|---|
| *H01L 27/02* | (2006.01) | |
| *H01L 29/423* | (2006.01) | |
| *H01L 29/78* | (2006.01) | |
| *H01L 29/49* | (2006.01) | |
| *H01L 21/28* | (2006.01) | |
| *H01L 29/43* | (2006.01) | |
| *H01L 29/66* | (2006.01) | |
| *H01L 27/06* | (2006.01) | |
| *H03K 19/0185* | (2006.01) | |
| *H03K 19/003* | (2006.01) | |
| *H01L 29/06* | (2006.01) | |

(52) U.S. Cl.
CPC .... *H01L 27/0288* (2013.01); *H01L 21/28052* (2013.01); *H01L 27/0255* (2013.01); *H01L 27/0629* (2013.01); *H01L 29/42368* (2013.01); *H01L 29/435* (2013.01); *H01L 29/4916* (2013.01); *H01L 29/4933* (2013.01); *H01L 29/66659* (2013.01); *H01L 29/7835* (2013.01); *H03K 19/00361* (2013.01); *H03K 19/018507* (2013.01); *H01L 29/0692* (2013.01)

(58) Field of Classification Search
None
See application file for complete search history.

(56) References Cited

U.S. PATENT DOCUMENTS

| | | | | |
|---|---|---|---|---|
| 4,829,344 A | * | 5/1989 | Bertotti | ............... H01L 27/0248 257/546 |
| 6,765,772 B2 | * | 7/2004 | Lee | ..................... H01L 27/0251 361/56 |

(Continued)

*Primary Examiner* — Andres Munoz
(74) *Attorney, Agent, or Firm* — NSIP Law

(57) ABSTRACT

The present examples relate to a semiconductor chip having a level shifter with an electrostatic discharge (ESD) protection circuit and a device applying to multiple power supply lines with high and low power inputs to protect the level shifter from the static ESD stress. More particularly, the present examples relate to using a feature to protect a semiconductor device in a level shifter from the ESD stress by using ESD stress blocking region adjacent to a gate electrode of the semiconductor device. The ESD stress blocking region increases a gate resistance of the semiconductor device, which results in reducing the ESD stress applied to the semiconductor device itself.

17 Claims, 16 Drawing Sheets

(56) References Cited

U.S. PATENT DOCUMENTS

| | | | |
|---|---|---|---|
| 2007/0181941 A1* | 8/2007 | Lin | H01L 29/42368 257/335 |
| 2013/0027823 A1* | 1/2013 | Wu | H02H 9/046 361/56 |
| 2014/0264576 A1* | 9/2014 | Zhang | H01L 29/7817 257/337 |
| 2015/0102405 A1 | 4/2015 | Ryu et al. | |

* cited by examiner

SEMICONDUCTOR DEVICE IN A LEVEL SHIFTER WITH ELECTROSTATIC DISCHARGE (ESD) PROTECTION CIRCUIT AND SEMICONDUCTOR CHIP

CROSS-REFERENCE TO RELATED APPLICATION(S)

This application claims the benefit under 35 U.S.C. §119(a) of Korean Patent Application No. 10-2015-0034921, filed on Mar. 13, 2015 in the Korean Intellectual Property Office, the entire disclosure of which is incorporated herein by reference for all purposes.

BACKGROUND

1. Field

The following description relates to a semiconductor device in a level shifter with an electrostatic discharge protection circuit. The following description also relates to a semiconductor chip to protect a thin gate oxide of such a semiconductor device from an Electrostatic Discharge (ESD) stress.

2. Description of Related Art

A level shifter refers to a circuit configured to change a voltage level of a semiconductor chip interior, such as a Display Drive IC (DDI). For example, the level shifter converts a low voltage signal to a medium or high voltage signal. Thus, the level shifter is positioned between multiple power supply lines with high and low voltage inputs, and changes voltage appropriately as needed.

A semiconductor device in a level shifter is placed in a level shifter block that may not provide enough driving current because a gate input voltage is at too low a voltage. This situation occurs because there is a limit in increasing a driving current since a thick gate insulating layer is used in such a situation.

Accordingly, a semiconductor device in a level shifter with a relatively thin gate insulating layer may be used, but such semiconductor device in a level shifter is vulnerable to an ESD stress. The vulnerability occurs because, when ESD stress or Electrical Over-Stress, hereinafter referred to as "EOS", is applied to the semiconductor device in a level shifter, a thin gate insulating layer is easily destroyed. Hence, an ESD protection circuit and device is necessary to prevent or block the ESD stress of a semiconductor device from occurring in a level shifter and damaging the thin gate insulating layer.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The present examples have as one objective to provide an electrostatic discharge protection circuit and device that protects a thin gate insulating layer by blocking an electrostatic discharge (ESD) stress.

Further, the present examples provide an electrostatic discharge protection circuit and device that reduce the ESD stress by increasing a gate resistance of the semiconductor device in a level shifter.

Further, the present examples provide an electrostatic discharge protection circuit and device to efficiently protect a level shift block in a core device from the ESD stress by facilitating discharging of the ESD stress by adding a back-to-back diode.

An electrostatic discharge protection circuit and device applied on a multiple power supply lines with high and low power inputs, according to an example, adds a resistor on a gate used in a semiconductor device in a level shifter and thereby relieves an ESD or EOS stress. Accordingly, there is an effect of preventing a thin gate insulating layer of the semiconductor device in a level shifter.

Furthermore, core devices are protected from the ESD stress by easily discharging the ESD stress through interconnecting a back-to-back diode with a ground line.

Thus, a semiconductor device in a level shifter featuring resistance to the ESD stress and various signal noises is formed.

In one general aspect, a semiconductor chip includes a first input pad and a first ground pad located in a low voltage region on a semiconductor substrate, a second input pad, and a second ground pad located in a high voltage region on the semiconductor substrate, a first electrostatic discharge (ESD) clamp formed between the first input pad and the first ground pad, and a level shifter including a semiconductor device and an ESD stress blocking region, wherein the semiconductor device includes a gate insulation layer having a thin gate insulation layer portion and a thick gate insulation layer portion, and a gate electrode formed over the gate insulation layer, and wherein the ESD stress blocking region is adjacent to the gate electrode.

The ESD stress blocking region may include a non-silicided polysilicon layer.

The semiconductor chip may further include a second ESD clamp connected between the second input pad and the second ground pad.

The ESD stress blocking region may protect the semiconductor device from Charged Device Model (CDM) ESD stress that occurs near the semiconductor device.

The ESD stress blocking region may have a higher resistance than that of the gate electrode.

The ESD stress blocking region may be connected to the gate electrode of the semiconductor device.

The first ESD clamp may include a gate grounded N-channel Metal Oxide Semiconductor (NMOS).

The semiconductor chip may further include a back-to-back diode located between the first ground pad and the second ground pad.

The semiconductor device may include an Extended Drain Metal Oxide Semiconductor (EDMOS) or a Laterally Diffused Metal Oxide Semiconductor (LDMOS), and the ESD stress blocking region may be interconnected to the EDMOS or the LDMOS.

The semiconductor chip may further include a first path formed between the first input pad and the first ground pad, and a second path formed between the first input pad and the second ground pad, wherein the second path has higher resistance than the first path.

In another general aspect, a semiconductor device in a level shifter includes a gate insulating layer including a thin gate insulation layer and a thick gate insulation layer formed on a substrate, a gate electrode formed on the gate insulating layer, and a gate protection region connected to the gate electrode, wherein both the gate protection region and the gate electrode include a polysilicon layer.

The semiconductor device in a level shifter may further include a drain region located adjacent to the thick gate insulation layer, a source region located adjacent to the thin gate insulation layer, and an extended drain junction region of a second conductivity type located in a well region of a first conductivity type, wherein the extended drain junction region overlaps with the gate electrode and extends to the well region under a portion of the thin gate insulating layer.

The gate protection region may have a greater resistance than that of the gate electrode.

The gate protection region may include a non-silicide layer.

The gate protection region may include a counter doped region or a polysilicon resistor.

In another general aspect a semiconductor chip includes a semiconductor substrate, including a first input pad and a first ground pad located in a low voltage region of the semiconductor substrate, a second input pad and a second ground pad located in a high voltage region of the semiconductor substrate, a first ESD clamp located between the first input pad and the first ground pad, and a level shifter including a semiconductor device including a gate insulator, including a thin gate insulation layer and a thick gate insulation layer, and a gate electrode formed over the gate insulator, and an ESD stress blocking region located adjacent to the gate electrode.

The semiconductor chip may further include a second ESD clamp connected between the second input pad and the second ground pad.

The ESD stress blocking region may have a higher resistance than that of the gate electrode.

The first ESD clamp may include a gate grounded NMOS.

The semiconductor device may include an Extended Drain Metal Oxide Semiconductor (EDMOS) or a Laterally Diffused Metal Oxide Semiconductor (LDMOS), and the ESD stress blocking region may be interconnected to the EDMOS or the LDMOS.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, an example is described further with reference to the attached drawings.

Figure 1A:
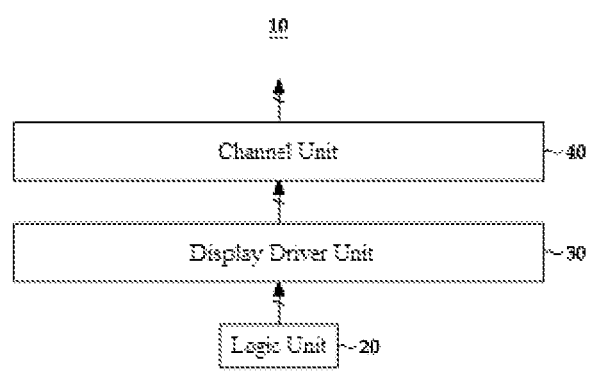
FIG. 1A is a block diagram of a DDI chip including a display driving unit of an example.
Figure 1B:
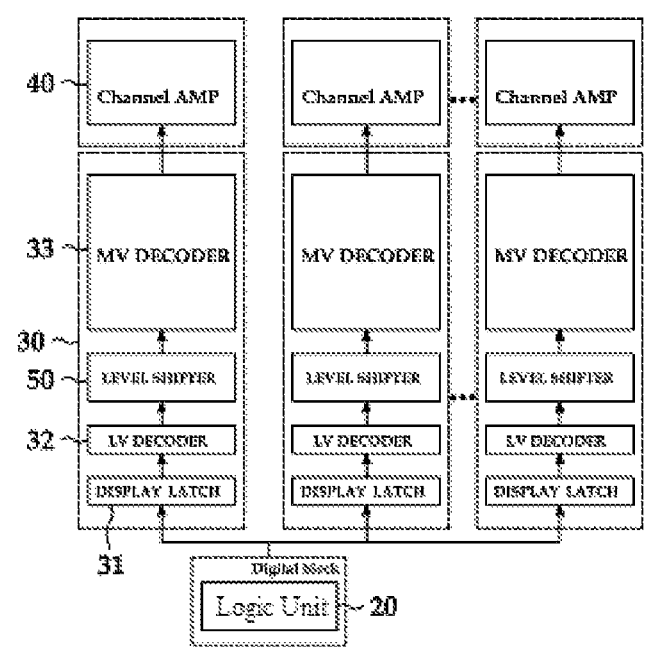
FIG. 1B is a detail DDI block diagram of an example.

FIGS. 1A and 1B are block diagrams of a DDI 10 including a display driving unit 30 illustrating an example.

A Display Drive IC (DDI) 10 is an IC required for driving a display panel that electrically provides a driving signal and data to a display panel for displaying words and/or images on a screen.

The DDI 10 providing such functionality includes a logic unit, such as a logic unit 20, a display driving unit 30 and a channel unit 40 as illustrated in FIG. 1A. Additionally, the display driving unit 30 and the channel unit 40 are provided in a quantity according to a number of channels required, based on a screen resolution. For example, one logic unit 20 controls the operation of the display driving unit 30 and the channel unit 40 respectively. Thus, the display driving unit 30 transmits a decoded signal to respective channels of the channel unit 40 according to a control signal from a logic unit 20.

FIG. 1B is a detailed block diagram corresponding to the example of FIG. 1A. Referring to FIG. 1B, a display driving unit 30 and a channel unit 40 are formed according to a number of channels. For example, when a number of channels is 2016, a number of display driving units 30 and channel units 40 is also 2016.

The display driving unit 30 includes a latch unit 31, a first decoder 32, a level shifter 50 and a second decoder 33. The latch unit 31 latches a driving signal received from a logic unit 20 and a data latched all at once, a first decoder 32 decodes a low voltage level, and a second decoder 33 decodes a medium voltage. A level shifter 50 placed between the first decoder 32 and the second decoder 33 converts the voltage level. In other words, the level shifter 50 is a circuit converting voltage levels in a semiconductor IC, for example a DDI. For example, a voltage level of 1.2 V is converted to a voltage level of 7.7 V. Accordingly, the first decoder 32 decodes a voltage of 1.2 V and transmits the voltage to a level shifter 50 and the second decoder 33 transmits 7.7 V voltage converted by the level shifter 50 to a channel 40 connected to a back terminal.

Figure 2A:
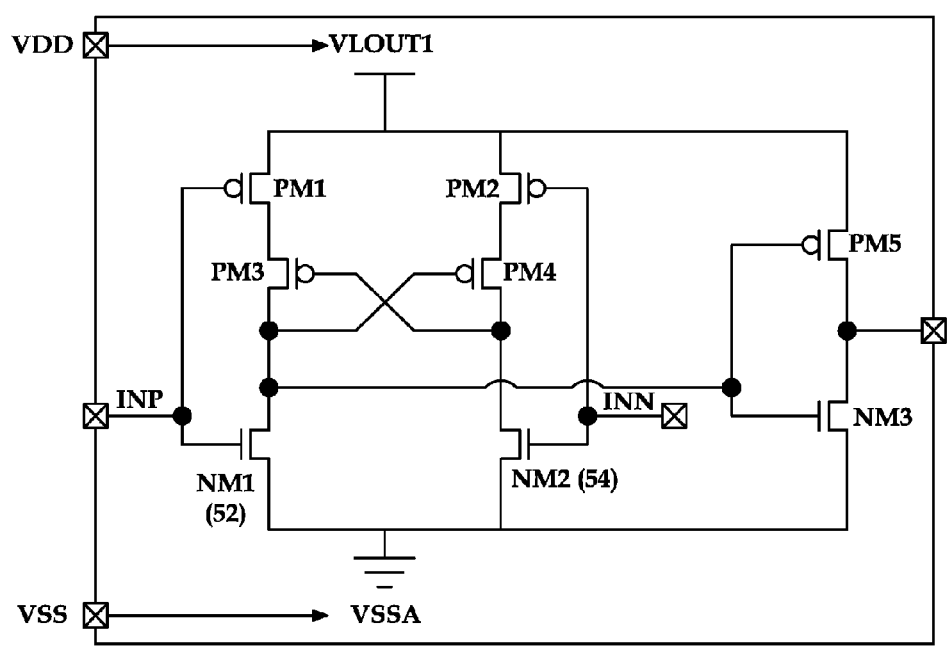
FIG. 2A is a level shifter diagram including a semiconductor device in an example.

FIG. 2A is a circuit diagram illustrating a level shifter 50 block that is illustrated in FIGS. 1A-1B. With reference to a level shifter 50 structure of FIG. 2A, an input terminal, such as INN or INP, of the level shifter 50 is connected to a first NMOS NM1 52 and a second NMOS M2 54. The first NMOS NM1 52 and the second NMOS NM2 54 have differential inputs INN, INP as gate inputs respectively of one terminal of a main current path has a common connection with a ground terminal GND. Furthermore, respective terminals of that respective main current path are connected to respective outputs OUTN, OUTP.

Herein, when the first NMOS 52 and the second NMOS 54 are formed as transistors of a high voltage device structure using the aforementioned approach, a design area of a level shift block increases, and thereby a size of a DDI also increases. Accordingly, an aspect of the present examples is to configure the transistor positioned on an input terminal of the level shifter as a Laterally Diffused Metal Oxide Semiconductor (LDMOS) or Extended Drain Metal Oxide Semiconductor (EDMOS) to minimize an area of a transistor in such a level shifter. In alternative approaches, a medium voltage device or a high voltage device including a gate insulating layer with a thick thickness was used, and by use of such a thick gate insulating layer, when 0.5 V to 2 V is applied to the gate electrode of the device, a drain current $I_{dsat}$ is sufficiently low, such that a range of a channel region is potentially large. Accordingly, a device area becomes large. Thus, an example requires a level shift semiconductor device that minimizes a size of a semiconductor device with a high drain current Idsat even when 0.5 V-2 V is applied to its gate electrode. Here, in an example, the level shift semiconductor device uses an nEDMOS or an nLDMOS device. A gate insulating layer of a level shift semiconductor device uses an insulating layer with different thicknesses in contact with each other. A region with different thicknesses exists in one gate insulating layer.

Figure 2B:
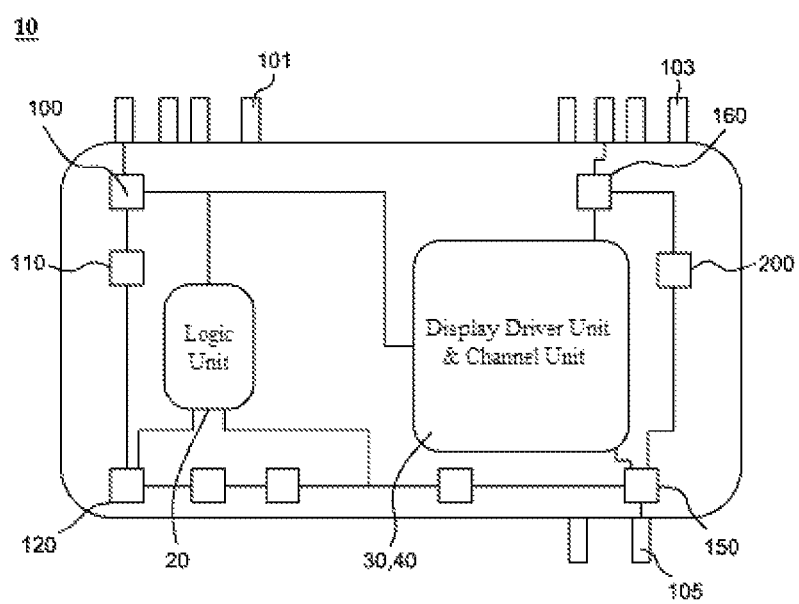
FIG. 2B is a semiconductor chip including a display driving unit with an ESD protection circuit of an example.

FIG. 2B is a semiconductor chip 10 including a display driving unit with an ESD protection circuit according to an example. A semiconductor chip 10 is an example of a semiconductor chip such as a display driver IC (DDI). Such an example semiconductor chip 10 potentially includes any appropriate integrated circuit (IC) parts. As illustrated, an example includes a low voltage input pad LV-VDD, 100 which is a first input pad, and a low voltage ground pad LV-VSS 120, which is a first ground pad, a high voltage input pad HV-VDD 160, which is a second input pad and a high voltage ground pad HV-VSS 150, which is a second ground pad. The input pads and ground pads are arranged around the border of the semiconductor chip 10. A semiconductor chip 10 also has multiple power supply lines received at high power input pad 160 and low power input pad 100. In the example of FIG. 2B, a low voltage or low power (LV) input pad 100 is connected to an LV input pin 101. Also in the example of FIG. 2B, a high voltage or high power HV input pad 160 is connected to an HV input pin 103. Also, a high voltage or high power HV ground pad 150 is connected to a ground pin 105. Thus, the VDD herein is to be seen as a plus input pad, and the VSS is to be seen as a minus input pad. A minus input pad is potentially used as a ground source.

The semiconductor chip 10 includes the core units such as logic unit 20, display driver unit 30 and channel unit 40 as mentioned in FIG. 1. The logic unit 20 is connected to the LV input pad 100 and the LV ground pad 120. The display driver unit 30 and channel unit 40 are connected to one another by LV input pad 100, HV input pad 160 and an HV output pad that is not shown, because the display driver unit 30 includes a level shifter 50 that converts a low voltage signal into a medium or high voltage signal. The ESD clamp 110 protects the logic unit 20, display driver unit 30 and channel unit 40 from ESD events or ESD stress currents.

Figure 3:
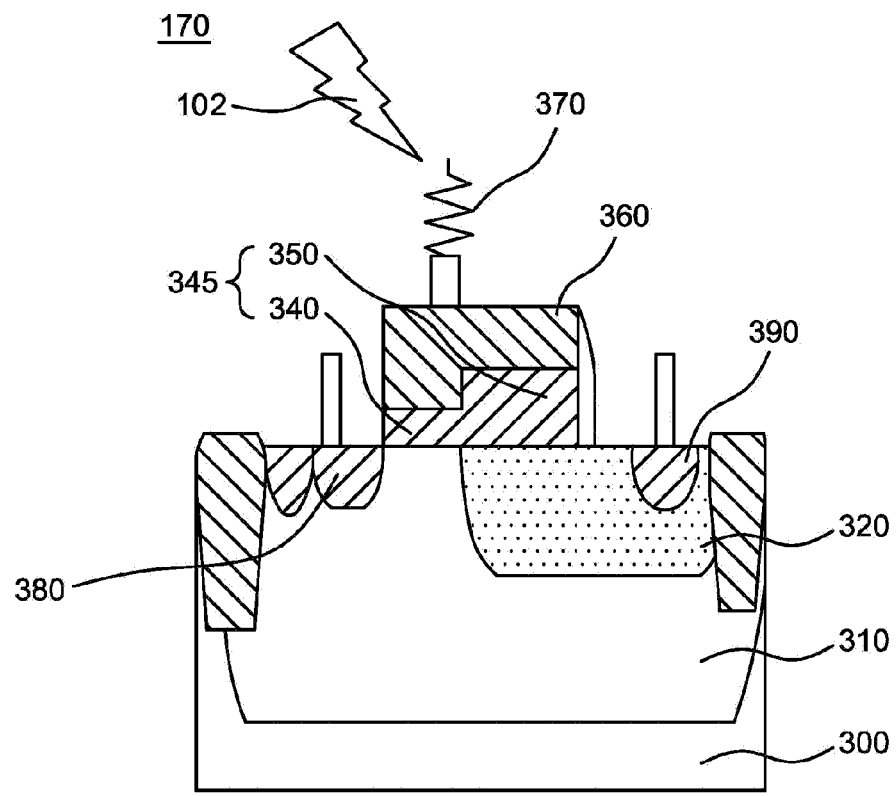
FIG. 3 is a cross-section of a semiconductor device in a level shifter of an example.

FIG. 3 illustrates a cross-section of a level shift semiconductor device, to be referred to simply as a "semiconductor device", including the gate insulating layer with different thicknesses, according to an example. The first NMOS 52 and the second NMOS 54 devices illustrated in FIG. 2A are illustrated as a semiconductor device 170 in a level shifter, where FIG. 3 is a cross section of such a level shifter. The semiconductor device 170 in a level shifter 175 according to an example includes gate insulating layers 340, 350 wherein a thin gate insulating layer 340 and a thick gate insulating layer 350 are in contact with each other, below a gate electrode 360. An example includes using EDMOS or LDMOS device structures with the above insulating layer approach.

The semiconductor device 170 according to an example includes a first conductivity type, such as P type, well region 310 formed on a substrate 300, a second conductivity type, such as N-type drain region 390, and a source region 380 formed on the well region 310, a first gate insulating layer 340 located near the source region 380, a second gate insulating layer 350 with a thickness thicker than the first gate insulating layer 340 and arranged near the drain region 390, a gate electrode 360 arranged on the first and second gate insulating layers 340 and 350, a second conductivity type extension drain junction region 320 formed to extend onto a part of a region of the first gate insulating layer 340 in a direction towards a source region 380 from the drain region 390 and to overlap with the gate electrode 360, and a gate protection region 370 formed on the gate electrode 360. The gate protection region 370 becomes an ESD stress blocking region 210 that is a non-silicided polysilicon layer. Therefore the gate protection region 370 includes a non-silicided polysilicon layer. No silicide treatment is performed on the gate protection region 370.

However, an inflow of an ESD stress 102 having a high voltage or current into the semiconductor device potentially destroys the thin gate insulating layer 340 of the semiconductor device. Also, when there is no gate protection region 370 connected with the gate electrode 360, the semiconductor device is more vulnerable to the ESD stress 102. Accordingly, an example is intended to solve this problem. In an example, a level shifter 175 includes a semiconductor device 170 and an ESD stress blocking region 210. The ESD stress blocking region 210 is located adjacent to a gate electrode 360 of the semiconductor device 170.

Figure 4:
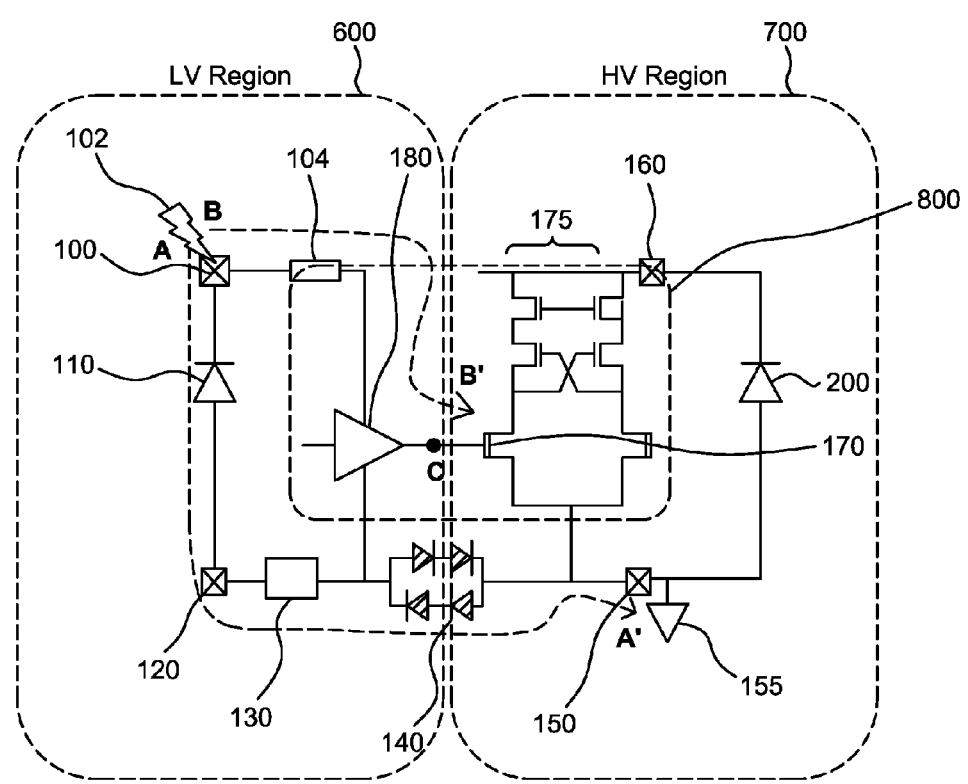
FIG. 4 is a semiconductor chip having a level shifter with an electrostatic discharge protection circuit applied to multiple power supply lines with high and low power inputs according to an example.

An example includes a semiconductor chip having a level shifter with an ESD circuit according to FIG. 4 to protect the semiconductor device 170. As illustrated, an example includes a low voltage input pad LV-VDD 100, which is a first input pad and a low voltage ground pad LV-VSS 120, which is a first ground pad, a high voltage input pad HV-VDD 160, which is a second input pad 160 and a high voltage ground pad HV-VSS 150, which is a second ground pad. Herein, an input pad may be connected to an input pin. The VDD herein may be seen as a plus input pad, and VSS as a minus input pad. A minus input pad may be used as a ground source.

A low voltage region 600 includes the low voltage input pad 100 and a low voltage ground pad 120. The low voltage region 600 also includes a logic unit 20, as shown in FIG. 2B. The logic unit 20 includes a plurality of low voltage transistors. A high voltage region 700 includes the high voltage input pad 160 and high voltage ground pad 150. A high voltage region 700 also includes the display driving unit 30 and the channel unit 40, as illustrated in FIG. 2B. The display driving unit 30 and the channel unit 40 also include a plurality of high voltage transistors. In this example, a low voltage transistor with a low input voltage of about 1.8 V or about 5 V is potentially formed in the low voltage region. As another example, a high voltage transistor with an input voltage of medium voltage or high voltage ranging from about 6-30 V is formed. Accordingly, an ESD circuit of an example is designed under circumstances with two different power sources, because of the use of low voltage and high voltage input voltages in respective portions of the ESD circuit. In this example, the high voltage ground pad 150 is connected with a ground reference 155. The high voltage region has a substantially larger area than the low voltage device region, and therefore the high voltage region includes more charged carriers than the low voltage region. Accordingly, it is recommended that the high voltage ground pad 150, rather than the low voltage ground pad 120, be connected to the ground reference 155.

Additionally, as shown in the circuit diagram of FIG. 4, a first ESD clamp 110 connected between the low voltage input pad 100 and the low voltage ground pad 120 is arranged. Likewise, a second ESD clamp 200 is also arranged between a high voltage input pad 160 and a high voltage ground pad 150. Accordingly, although the ESD stress 102 flows into the low voltage input pad 100 or the high voltage input pad 160, an example helps the ESD stress 102 to efficiently flow out into a ground reference 155 through the first ESD clamp 110 and the second ESD clamp 200 by passing into respective ground pads 120, 150.

The first ESD clamp 110 and the second ESD clamp 200 formed in the circuit of an example uses a Gate Grounded NMOS (GGNMOS) or Gate Coupled NMOS (GCNMOS) or alternatively uses a rail based clamping circuit of a RC-triggered big Field Effect Transistor (FET) form. In other words, it is potentially varying forms of an ESD clamp that act as a device that is able to discharge a high ESD current of VDD and VSS when the ESD stress flows in.

Also, a first resistor 130 and a back to back diode 140 are connected in series between the low voltage ground pad 120 and the high voltage ground pad 150. A back-to-back diode 140 reduces current noise penetrating into the low voltage region provided by the high voltage region and the back-to-back-diode is also applicable to current flow in the reverse direction, that is, from the low voltage region to the high voltage region. Herein, the first resistor 130 indicates a total resistance of metal interconnection between the low voltage ground pad 120 and the high voltage ground pad 150.

The ESD design ensures a current path for output of all stress between an input and output (I/O) pad and an interior ground pad (ground connection) because different ground references are used for a noise block of a logic unit and a core unit in an IC design. Accordingly, the diode enables an effective ESD current flow between ground pads, thereby facilitating a ground connection. The back-to-back diode 140 is provided with the first and second ESD clamps 110, 200 for efficient protection of a core circuit against ESD. For example, many ESD standards such as the Human Body Model (HBM), Machine Model (MM), Charged Device Model (CDM), and IEC 61000-4-2 are applicable. IEC 61000-4-2 has been developed to test for robustness and ensure ESD management and immunity under at least 8 kV contact discharge or 15 kV air discharge.

Additionally, an inverter or a buffer, hereinafter referred to as an inverter, 180 is included between the low voltage input pad 100 and the high voltage ground pad 150. The inverter 180 provides an inverter operation for a gate of a semiconductor device 170.

A core circuit or internal circuit 800 is formed between a high voltage input pad 160 and a high voltage ground pad 150 applied with an external signal. A level shifter 175 is included in the core circuit or internal circuit 800 and the semiconductor device 170 is included in the level shifter 175. In the example of FIG. 4, the semiconductor device 170 corresponds with an NM1 52 and an NM2 54 in the DDI circuit of the previously discussed FIG. 2A.

As illustrated in FIG. 4, a semiconductor chip having a level shifter with first ESD discharge circuit is displayed with a dotted-arrow, from A to A', that has a high resistance element. The first ESD discharge path, from A to A' has a high metal interconnection wire resistance, hereinafter referred to as a first resistance, 130 and a back-to-back diode 140 wherein a combined resistance of both added together is very large. The metal interconnection wire resistance in this example is a metal interconnection wire resistance for routing an ESD.

For example, when a ESD stress current is applied, the stress current meets various components present in the A to A' current path that present a combined resistance. These components comprise first ESD clamp 110, first resistor 130, and back-to-back-diode 140. Each component has its own resistance. Due to the resistance of each component, there are several voltage drops in the A to A' current or signal path. The sum of the voltage drops appears around 40 V in the A to A' signal path. In this case, a reference voltage is applied to the high voltage ground pad 150 and ground reference 155 and a positive ESD stress zapping +Zapping is applied to the low voltage input pad 100, and there is a first voltage drop by first ESD clamp 110 which is about 4V and a second voltage drop by first resistor 130 which is about 30V, assuming a resistance of about 30 Ohm, and a current of around 1 A, and a third voltage drop by the back-to-back diode 140 which is around 6V.

Hence, a total voltage drop of about 40 V, including 4 V+30 V+6 V, as discussed above, is present when following a first ESD discharge path A to A' from the low voltage input pad 100 to a high voltage ground pad 150. However, not only a discharge path A to A' but also an equivalent circuit path B to B' that passes through the level shift is formed between the low voltage input pad 100 and a high voltage ground pad 150. This equivalence also means that a second ESD discharge path B to B' also experiences stress under an equivalent 40 V voltage drop in the signal line. In other words, about 40 V of voltages are applied also to a gate electrode 360 of the semiconductor device.

An identical voltage drop is also applied to an inverter 180 but there is no problem when stress flows into an inverter device. Here, the ESD discharge path is designed to easily flow into a substrate region passing through source/drain region. In other words, the ESD discharge path is designed to easily flow out into the substrate region through an N type well or a P type well region surrounding the source/drain region. Accordingly, the inverter device is not destroyed even though ESD/EOS stress occurs. Further, the inverter 180 is potentially discharged with the first ESD clamp 110 even though stress is applied because of a first ESD clamp 110 being connected in parallel.

Likewise, a 40 V voltage drop is directly applied to the semiconductor device 170 passing through the inverter 180. This voltage drop eventually enables a high voltage to be safely applied to a gate insulating layer formed between a gate and a substrate of the semiconductor device 170. Herein, a thin gate insulating layer 340 of FIG. 3 included in the semiconductor device 170 is potentially easily destroyed because the thickness of the thin gate insulating layer 340 is so thin that it cannot withstand a 40 V voltage. To prevent destroying the insulating layer 340, a resistor 104 that is a polysilicon resistor that has a high resistance is potentially arranged between a low voltage input pad 100 and the semiconductor device 170. This configuration is used to prevent the flow of the ESD stress to the B to B' path including the semiconductor device 170 due to the resistor 104 element. Such a resistor 104 is generally used to protect a core block, that is, to protect a gate insulating layer of a core device. However, the resistor 104 is arranged to be far from the semiconductor device 170. Hence controlling Charged Device Model (CDM) ESD stress that occurs near the semiconductor device 170 is potentially difficult. The Charged Device Model (CDM) event is widely recognized as a "real-world" ESD failure mode, representing a realistic portrayal of ESD failure. The primary CDM failure mechanism is attributed to dielectric failure, such as gate-oxide breakdown due to voltage overstress, especially voltage overshoot. Voltage overshoot is the amount by which an output exceeds its final value in response to a rapid change in load or input voltage, measured as a percentage of the nominal. Voltage overshoot can be observed during turn-on or following a step change in output load.

As further a explanation regarding CDM, a CDM ESD stress is formed inside a core circuit 800 aside from an ESD stress through external input pad. Here, an IC with a larger size potentially stores more static charge in its body, and thereby potentially applies another ESD stress due to this static charge. For example, in the case of a high voltage device in many cases a high voltage of 700 V or even greater is potentially applied. Hence, such a kind of charge is potentially formed. Accordingly, an example also potentially includes many static charges that potentially occur as ESD stresses through point "C" of FIG. 4, that is, between the CMOS inverter 180 and the semiconductor device 170. Furthermore, when a ground voltage is applied to the high voltage ground pad 150, electrons then immediately pass through the semiconductor device 170 and flow out into the ground. Thus, subsequently, the semiconductor device 170 is easily destroyed due to the thin gate insulating layer not being able to withstand the CDM ESD stress. However, the aforementioned resistor 104 is separated far away from the stress and hence the stress is hard to control.

Figure 5:
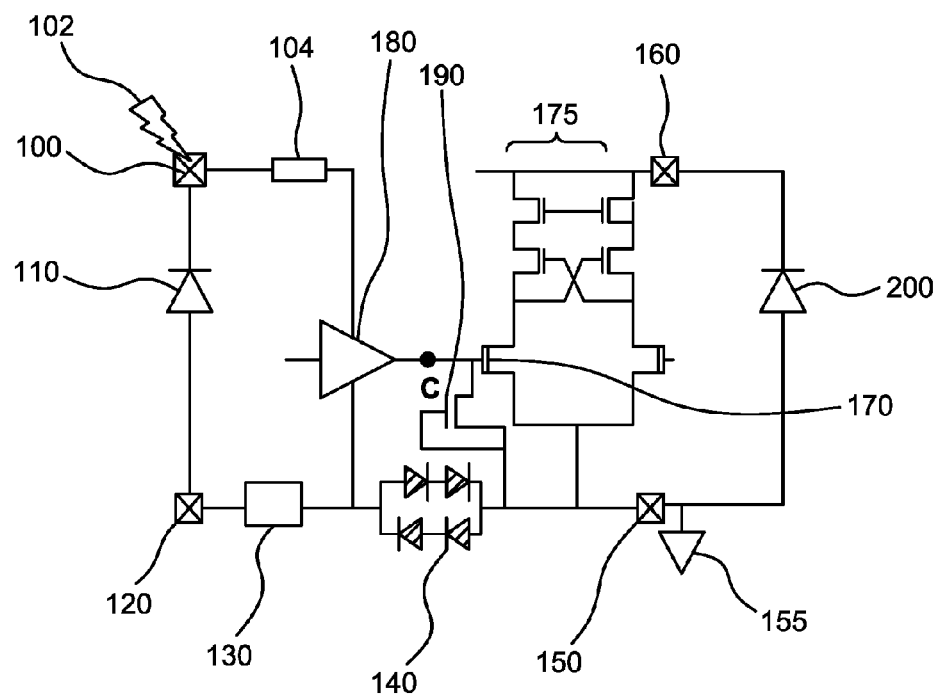
FIG. 5 is a semiconductor chip having a level shifter with an ESD circuit according to an example.

FIG. 5 shows a semiconductor chip with an ESD circuit to prevent the breakdown of the semiconductor device 170 due to the ESD stress. An ESD clamp that can bear an ESD stress 102 is arranged near the semiconductor device 170. In the example of FIG. 5, an ESD stress block clamp 190 is inserted directly in front of the semiconductor device 170. A third ESD clamp 190 that is potentially protected from the aforementioned CDM ESD stress refers to a low voltage clamp, that is, a small power clamp device with a GGNMOS structure. Such a scheme is potentially directed to a CDM ESD protection circuit or device 190 as discussed further, above.

The main function of the third clamp 190 is protecting gate insulating layers 340, 350 of the semiconductor device 170. The third clamp 190 discharges a CDM ESD stress of a high voltage that is generated between an inverter 180 with a high voltage ground pad. However, a unit cell size of a level shift block 175 increases due to the presence of the third ESD clamp 190. Further, the chip size of products using many level shifters potentially increases, and therefore a cost competitiveness of a DDI chip included in a level shift potentially decreases. In other words, a CDM ESD protection clamp, such as a small GGNMOS, is optionally included but there is a potential problem that a total area of a level shift block 175 might increase.

Figure 6:
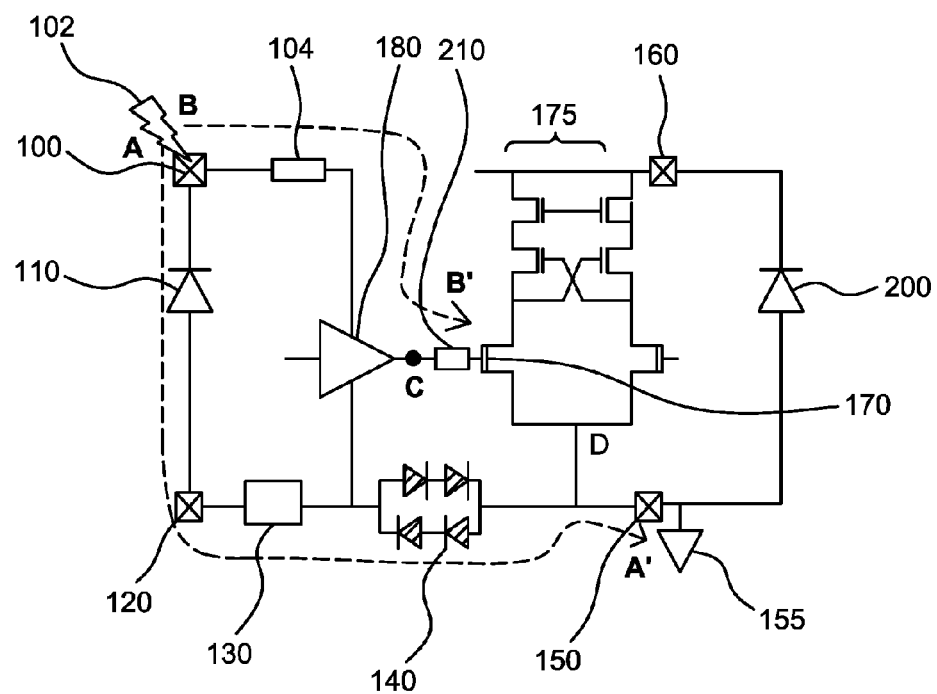
FIG. 6 is a semiconductor chip having a level shifter with an ESD circuit according to an example.

FIG. 6 is an optimized ESD circuit diagram for protection of a semiconductor device, according to another example, to solve the aforementioned problems. The circuit in the example of FIG. 6 protects the semiconductor device without an increase in the size of the level shift block 175. As illustrated in the example of FIG. 6, a static discharge protection device is similar to FIG. 4 but differs in that an ESD stress blocking region 210 that is electrically connected to the semiconductor device 170 is included in the example of FIG. 4.

In the example of FIG. 6, the ESD stress blocking region 210 is formed between the CMOS inverter 180 and the semiconductor device 170. In other words, the ESD stress blocking region 210 is formed in the core circuit 800 like an internal circuit block such as the level shift block 175. A level shifter 175 includes a semiconductor device 170 and an ESD stress blocking region 210. The ESD stress blocking region 210 is located adjacent to a gate electrode 360 of the semiconductor device 170. Resistance of the second path B to B' is higher than the first path A to A' because of the presence of the ESD stress blocking region 210. When an ESD stress 102 is applied to a low voltage input pad 100, the ESD stress 102 applied to the semiconductor device 170 by the ESD stress blocking region 210 is blocked. In other words, the ESD stress is not easily applied to the gate electrode of the semiconductor device 170, because the ESD stress blocking region 210 in the example of FIG. 6 has a high resistance. Accordingly, the ESD stress blocking region 210 directly blocks the CDM ESD stress, and prevents the CDM ESD stress from flowing into the gate electrode of the semiconductor device 170. Although the ESD stress 102 is input into the low voltage input pad 100 or the low voltage ground pad 120, the ESD stress is blocked in the example of FIG. 6, because the ESD stress blocking region 210 has a high resistance. The ESD stress blocking region 210 has a very simple structure, unlike a complicated structure of the aforementioned third ESD clamp. The ESD stress blocking region 210 includes a non-silicided polysilicon layer that has a higher resistance than the silicided polysilicon layer. For example, a non-silicided polysilicon layer with a higher resistance is able to block the ESD stress into the gate electrode of the semiconductor device 170. Such blocking results in increasing an ability of ESD protection. The ESD protection devices including the ESD stress blocking region 210 with non-silicide region or layer are strongly resistant to ESD stress 102 and result in the protection of semiconductor device 170 from an ESD stress.

The ESD stress blocking region 210 and the semiconductor device 170 are illustrated as being separated in the example of FIG. 6. However, such an illustration is for convenience of understanding, that is, both are potentially formed as one feature as adjoining with each other in an example. For example, as presented in FIG. 8, subsequently, the ESD stress blocking region 210 is formed by directly arranging the ESD stress blocking region 210 on the gate electrode 360 of the semiconductor device 170. The ESD stress blocking region 210 is formed by increasing a part of the gate electrode resistor by expanding the gate electrode of the semiconductor device 170. When arranging space is lacking, the ESD stress blocking region 210 is possibly formed as being physically separated from the gate electrode 360 of the semiconductor device 170 but is still electrically connected.

The ESD stress blocking region 210 has a higher resistance value than the first resistor 130. As aforementioned, the ESD stress blocking region 210 is directly connected to the gate electrode or physically separated, in various examples. Also, the ESD stress blocking region 210 is formed together with the gate electrode of the EDMOS device that is used as the semiconductor device 170. A polysilicon material is used as a gate electrode of the EDMOS device thereby making it possible for simultaneous formation at the same steps.

Further, in an example that uses an ESD stress blocking region, resistance of first resistor 130 is potentially lowered to around 1 ohm. In an example where the lowered resistance of the first resistor 130 has been used, the voltage drop of about 40 V between the low voltage input pad 100 and the high voltage ground pad 150 is possibly decreased to 11 V. Such a voltage drop is obtained by the following calculation. Since a first voltage drop by the ESD clamp 110 is around 4 V and a second voltage drop by the first resistor 130 is around 1 V, based on a 1 Ohm resistance, assuming current of 1 A, and a third voltage drop by the back-to-back diode 140 is around 6 V, a total voltage drop about 11 V (=4V+ 1V+6V) is obtained between the low voltage input pad 100 and the high voltage ground pad 150.

Likewise, reduction of resistance of the A to A' path, displayed using a thick dotted line, is important. The reduced resistance helps in discharging the ESD stress into the high voltage ground pad, because the A to A' path is a lower resistance path than the B to B' path. Consequently, the nEDMOS semiconductor device, that is, the semiconductor device 170, is protected from the ESD stress.

Figure 7:
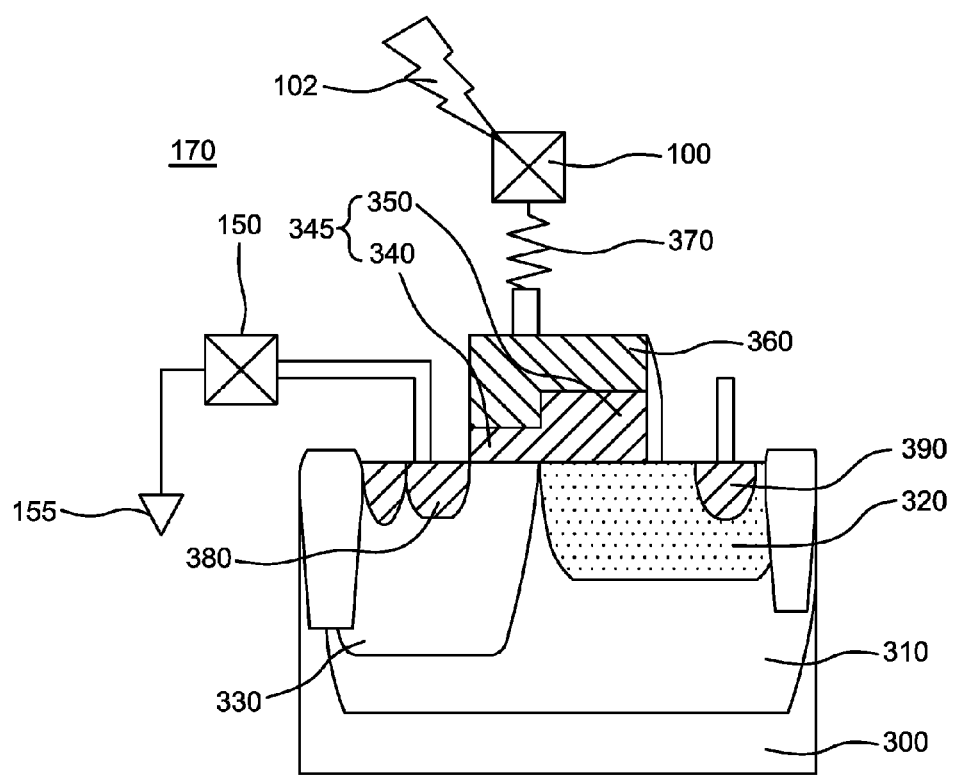
FIG. 7 is a cross-section of a semiconductor device with a gate protection region of an example.

FIG. 7 is a cross-sectional image illustrating the semiconductor device 170 illustrating a gate protection region 370 of an example.

The remaining main element illustrated in FIG. 7 is included as illustrated in the example of aforementioned FIG. 3. A P type body region 330 is formed below a thin gate insulating layer 340 with a feature of acting as a channel region. Further, the P type body region 330 is formed to surround a source region 380 and to be in contact with an N type extension drain region 320. Without the P type body region 330, a P well region 310 potentially replaces the channel region. Thus, the P type body region 330 is optional, and an example might not include the P type body region.

The example of FIG. 7 is also different from other examples in that the thin gate insulating layer 340 is protected from not only the ESD stress, as discussed previously, but also is protected from noise by adding the gate protection region 370 between the low voltage input pad 100 and the gate electrode 360 of the semiconductor device 170. In the example of FIG. 7, a resistance of 10 ohm to 10 Kohm is potentially applied to the gate protection region 370, but various other forms of resistor that are potentially included in a semiconductor are also potentially applied. For example, as aforementioned, doped polysilicon is used, in an example, as the material for the gate protection region 370 as well as for the gate electrode of nEDMOS device. Hence, there is an advantage in the reduction of a chip manufacturing cost since the manufacturing process is simplified. Further, the polysilicon without silicide is used as an alternative material for the gate protection region 370 with a predetermined resistance. Thus, the gate protection region 370 has an identical function as the ESD stress blocking region 210 of FIG. 6 aforementioned herein.

FIGS. 8, 9, 10 and 11 are plane views illustrating various features relating to the gate protection region of the semiconductor device of an example.

In examples, the gate protection region 370 of the semiconductor device of an example is formed with various resistance values by using various forms of polysilicon and ion implantation methods, and optionally including a silicide blocking layer and other similar approaches for adjusting resistance.

Figure 8:
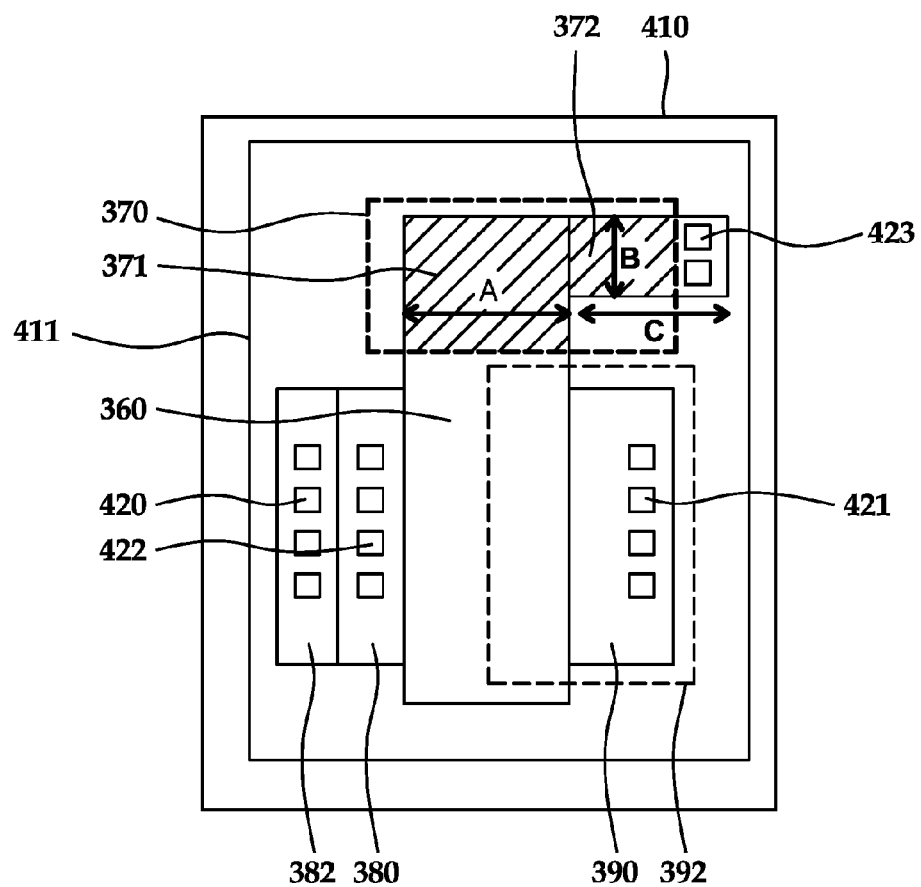
FIGS. 8-11 are plan views of a semiconductor device with a gate protection region of an example.

First, FIG. 8 illustrates a low voltage P type well 411 located on a DNW region 410 of a substrate region. A gate electrode 360 is located in the P type well 411 and a P+ contact region 420 is also formed in the P type well 411. Further, the gate protection region 370 in contact with the gate electrode 360 is also formed as illustrated in the example of FIG. 8. The gate protection region 370 is indicated using a dotted box that is a non-silicide. However, in an example, the gate electrode 360 region is formed using a silicide layer.

Generally, Cobalt Disilicide ($CoSi_2$), Nickel Silicide (NiSi), and Titanium Dislicide ($TiSi_2$) are examples of materials used for a silicide layer formed to decrease the gate resistance of the gate electrode 360. However, the gate protection region 370 is processed without the non-silicide materials being included. Thus, silicide formation is prevented by overlapping a silicide blocking layer, not shown, such as an oxide layer or a nitride layer, for providing for a non-silicide process. Thus, by virtue of being formed in this manner, a resistance per unit area of the gate protection region 370 is higher than that of the gate electrode 360. Accordingly, because of this approach that uses different processing techniques, the resistance of the entire gate region increases and thereby the ESD stress is potentially relieved, as discussed further, above.

Moreover, a N+ source contact region 422, a N+ drain contact region 421 and a gate contact region 423 are respectively formed, as shown in the example of FIG. 8. The source/drain contact regions 422, 421 and the gate contact regions 423 are processed with a silicide material. Also, a single gate insulating layer 345 with different thicknesses, including a thin gate insulation layer 340 and a thick gate insulation layer 350 is formed below the gate electrode 360. At the interface between the thin gate insulation layer 340 and the thick gate insulation layer 350, the thickness of gate insulation layer 345 is formed to change smoothly. A mask region 392 is illustrated in the example of FIG. 8 as being used to configure a thick gate insulating layer 350 region. Hereinafter, FIGS. 9-FIG. 11 omit repeated explanations regarding the same drawing elements, for brevity.

The gate protection region 370 is also formed of a polysilicon material that is a material identical with that of the gate electrode 360. Thicknesses of the second resistor region 370 and the gate electrode 360 are identical because they are formed in the same step. Further, the gate protection region 370 includes a first region 371 that extends in a longitudinal direction, that is a perpendicular direction with respect to that of the drain, of the gate electrode 360. The gate protection region 370 also includes a second region 372 having a predetermined width that extends in a perpendicular direction, that is a drain direction with respect to the first region 371. Thus, the second region is additionally formed so as to further increase the gate resistance when the gate protection region generated by the first region 371 is not sufficiently protective. However, when enough gate protection region is potentially received with the first region 371 only, the second region 372 might not be necessary. Also, there is potentially a problem of further increase of the entire area of the gate electrode because of the second region 372, leading to additional costs and other issues as discussed further, above.

In an example, the second region 372 is formed with a smaller width B than length C, thereby further increasing the gate resistance. As illustrated, the horizontal length of width B is formed with a minimum line width that is supported by the related technology node and the form of the resistor is formed to be longer in a drain direction to minimize the area of the semiconductor device.

Likewise, as illustrated in various examples, the gate protection region 370 may be formed in a bar-type shape to achieve maximum resistance and potentially increase actual resistance values by forming a resistor in various forms of "ㄱ", "ㄴ", "ㄷ", and "ㄹ", according to various examples. Thus, the resistor is potentially bent into various appropriate shapes that provide for increased resistance, in various examples, such as various shapes that resemble an L, a U or an S or a Z. The examples according to the above discussion protect the thin gate insulating layer 340 from the ESD stress and noise by adding the gate protection region 370 on the semiconductor device 170.

Figure 9:
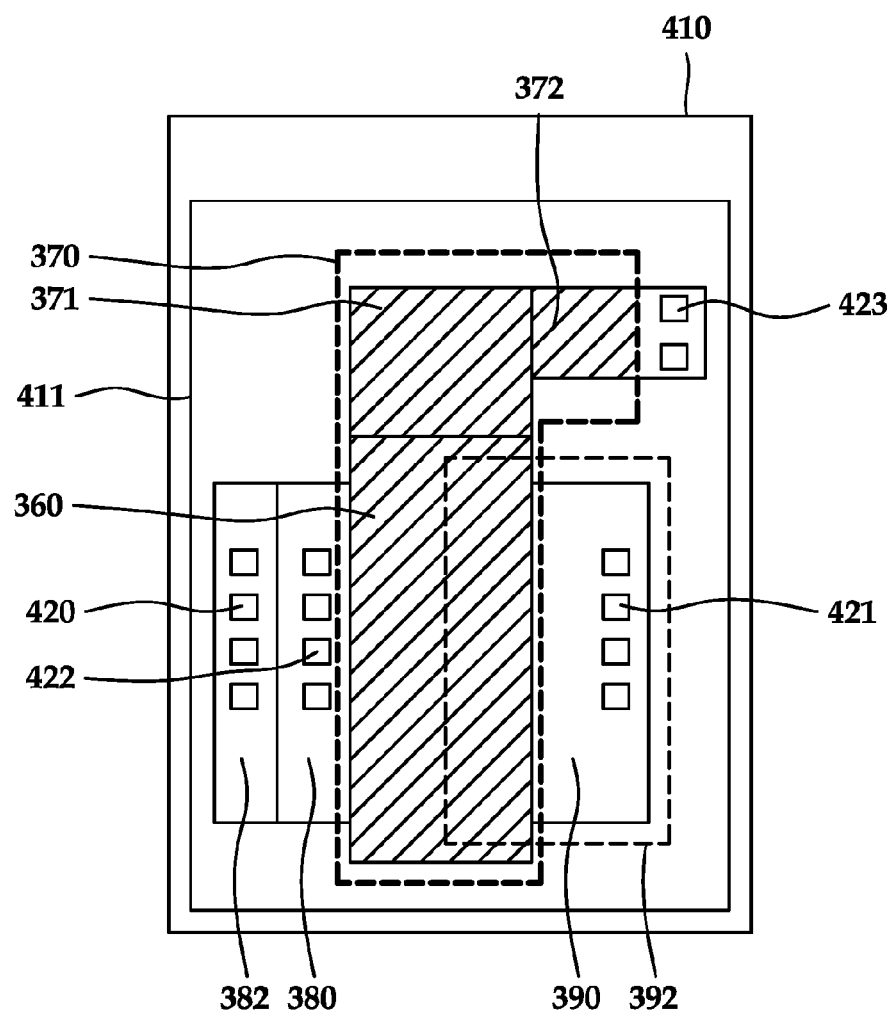

FIG. 9 is similar to FIG. 8, but has an extension of the non-silicide region. FIG. 8 illustrates the non-silicide region as being formed using a silicide protection layer in part of a region to form a gate protection region 370. However, FIG. 9 forms a silicide protection layer in almost all regions of a polysilicon except for only a part of the region. Thereby, the example of FIG. 9 forms the gate protection region 370 so that the polysilicon surface becomes a non-silicide in this area. Thus, FIG. 9 forms a silicide formation block layer to protect the entire region that is to be used as the gate electrode 360, thereby shifting material to form a non-silicide region. Thereby, a higher gate resistance than that illustrated in FIG. 8 is potentially obtained.

Figure 10:
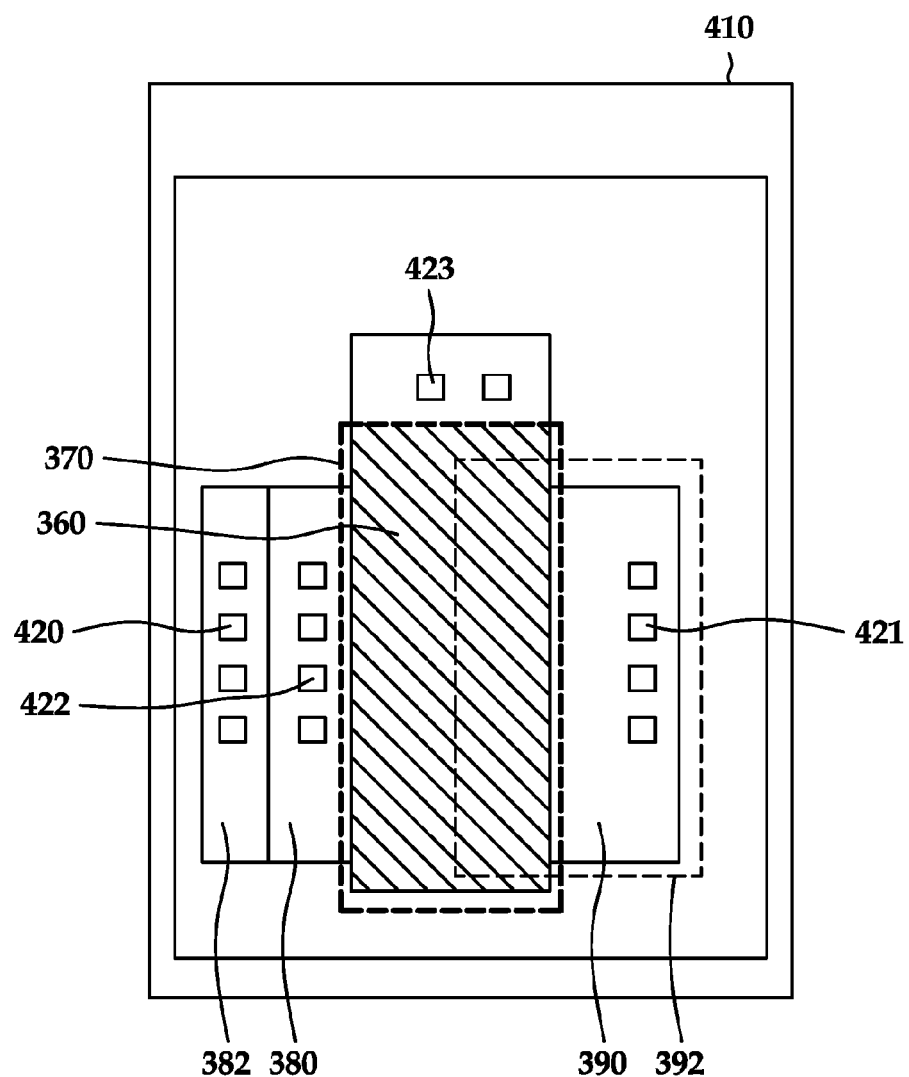

FIG. 10 illustrates a gate area that is minimized to have a smaller size than that of FIG. 8 and FIG. 9 and that is able to be efficiently used when the gate electrode 360 is designed to have a limited allowable area. In other words, a region configured to increase resistance next to the gate electrode 360, as illustrated in FIG. 8 or FIG. 9, might not be formed easily. FIG. 10 is similar to the other figures, but provides that the gate electrode 360 is changed to a non-silicide region as a whole. Thus, in FIG. 10, the gate protection region 370 potentially includes all portions of the gate electrode 360 of the semiconductor device. This approach is used to maximize a resistance value for the provided cell size. Although gate resistance is higher, EDMOS device features with respect to a level shift function and functionality are not adversely affected.

Figure 11:
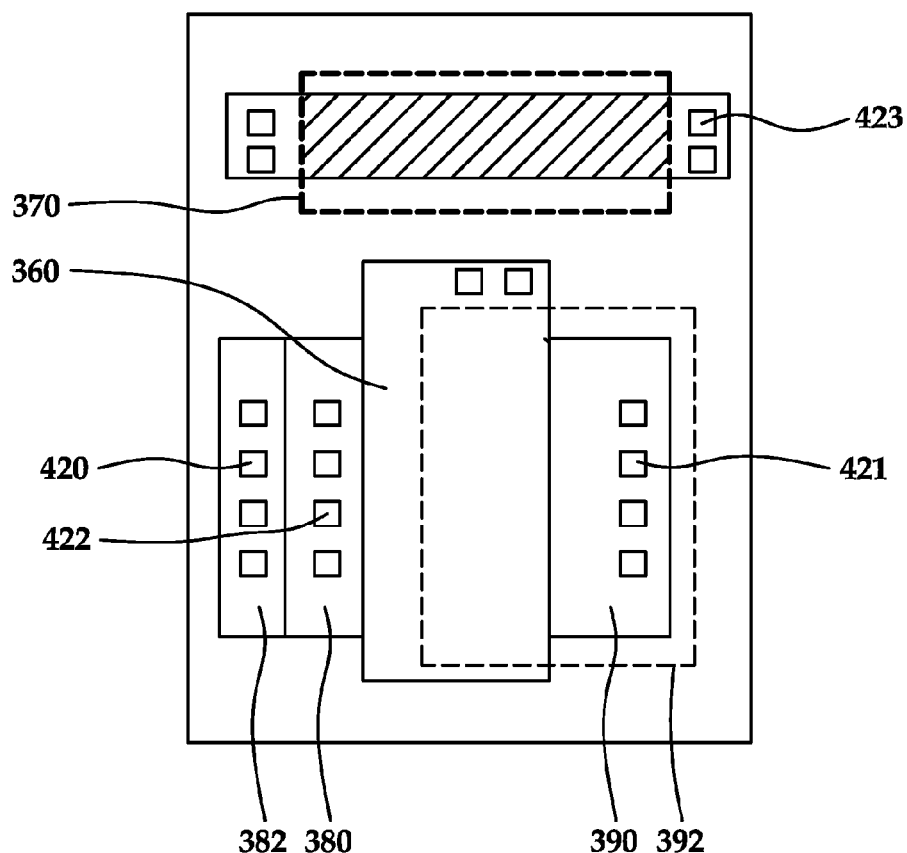

Unlike the aforementioned FIGS. 8 to 9, FIG. 11 potentially does not form the gate protection region 370 next to the gate electrode 360. Accordingly, the gate electrode region 360 and the gate protection region 370 are formed as being separated from each other by a predetermined distance. Although they are separated, in the example of FIG. 11, the aforementioned regions are connected using a metal interconnection wire. Thus, the gate electrode 360 and the gate protection region 370 are electrically connected. If the gate electrode 360 and the gate protection region 370 are formed to be separated, the structure becomes further immune to the ESD stress. Thus, if there are defects in the gate electrode 360 that is used in the semiconductor device, the ESD stress is applied to the direction of the gate electrode 360. However, when the gate electrode 360 and the gate protection region 370 are formed as being separated from each other, the ESD stress is already blocked in the gate protection region 370, and thereby, in such an example, has a more stable ESD immunity capability.

The aforementioned FIGS. 8 to 11 disclose an example of a method for protecting an insulating layer from an ESD stress by forming a gate protection region 370 that mainly uses a non-silicide material. Hereinafter the present examples relate to all process methods that can further increase additional resistance in order to block a flow of the ESD stress to a gate electrode that is used in a semiconductor device. In other words, all process methods that potentially increase a resistance associated with a polysilicon layer used as a gate electrode material are included as example methods. For example, there is a method of ion injecting N+/P+ dopants into the gate electrode in order to increase gate resistance. For example, a counter doping method is used. Also, an ion implantation process to lower resistance into a gate electrode is potentially skipped. High-R resistor ion implantation process is also optionally used.

For example, first, a counter doping method is used that includes ion injecting both N+/P+ dopants into the gate electrode such that ion injecting both N type dopant and P type dopant occurs after a polysilicon layer is formed on the gate electrode 360 and the gate protection region 370. Thus, entire doping concentration is maintained to be 1E15 to 1E20 atoms/cm$^3$. As a result, a gate protection region 370 with low gate resistance, derived as the total of the first gate resistance and the second gate resistance, is formed. Generally, an NMOS device and a PMOS device respectively require N type or P type of a high concentration in a source/drain region when forming a CMOS device. As discussed, steps of N+ ion implantation and P+ ion implantation are respectively included. Also, a mask is potentially opened so as to apply an both N+ ion implantation step and Pa+ ion implantation step to the resistor forming region of the present example. Thus, a net doping concentration of the gate electrode and the gate protection region is caused to be 1E15 to 1E20 atoms/cm$^3$ by a counter doping process.

In other words, N+ and P+ dopants are ion implanted respectively into an identical resistor region and are counter doped, thereby controlling a net-doping level. For example, when the P+ doping concentration is 2E18 atoms/cm$^3$ and N+ doping concentration is 2.5E18 atoms/cm$^3$, an entire net doping concentration is 5E17 atoms/cm$^3$ and a gate protection region with a higher gate resistance is optionally formed due to a decreased dopant concentration. Also, any ion implantation or doping process is potentially applied in an original CMOS process.

The second method for increasing the gate resistance includes skipping a portion of the ion implantation process. Generally, necessary processes of forming the gate electrode and pre-doping step are applied to decrease gate electrode resistor. However, the gate resistance does not decrease when these processes are not implemented. A dopant concentration implanted in the gate electrode 360 and the gate protection region 370 decreases accordingly, and thereby total gate resistance increases.

Another method of increasing gate resistance uses an High-R ion implantation process. A gate resistance formation process and a high resistance formation process are implemented simultaneously to increase the gate resistance. Accordingly, an entire manufacturing cost is potentially reduced. For example, an high-R resistor forming process is one that uses a semiconductor manufacture process. Here, a polysilicon resistor that has a high resistance is a passive device that is selected when polysilicon resistor that has high resistance is required. A polysilicon resistor having high resistance is also formed with other polysilicon regions, which thereby are formed during the same step of the gate electrode forming process. The high resistance polysilicon resistor forming process forms such a polysilicon resistor through ion implantation process applied on the polysilicon surface.

Figure 12:
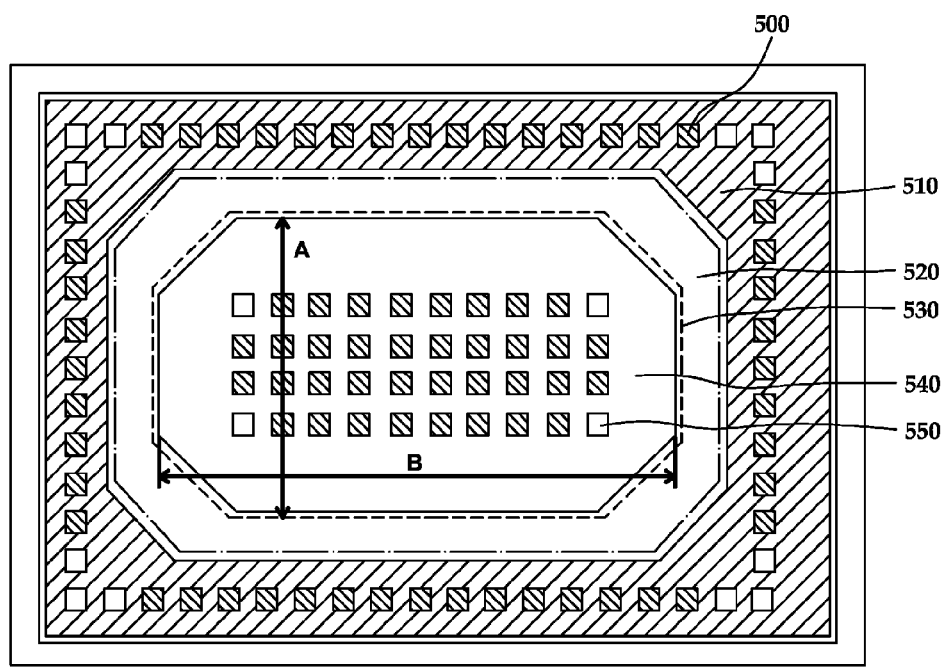
FIG. 12 is a plan view of an ESD protection diode of an example.

The following description relates to a plane view of a back-to-back diode 140 illustrated in the aforementioned FIG. 4 to FIG. 6 through a view presented in the example of FIG. 12.

FIG. 12 is a diagram of an example of an ESD protection diode layout illustrating that a circumference (A+B)×2 of an inner active of a back-to-back diode 140 is potentially over 100 μm. In the example of FIG. 12, the drawing illustrates a P+ contact region 500, a P+ high concentration region 510, an insulation region 520, such as isolation region that is a LOCOS, STI, MTI, etc., a P well region 530, an N+ high concentration region 540, and an N+ contact region 550. Back-to-back diodes are used to reduce noise levels in a level shift block. The back-to-back diode is formed between the low voltage ground pad and the high voltage ground pad. A number of the back-to-back diodes, with reference to FIG. 6, as presented in the example of FIG. 12, are optionally used from terminal 1 to terminal 3. The inner active circumference that is an anode of respective diodes should be at least 100 μm to bear sufficient ESD stress. For easy and safe release of an ESD stress when ESD stress occurs, the number of diodes or the number of series of diodes is to be minimized. Because, there is a smaller number of diodes, there is a smaller amount of resistance. Hence, the ESD stress is released easier.

Figure 13:
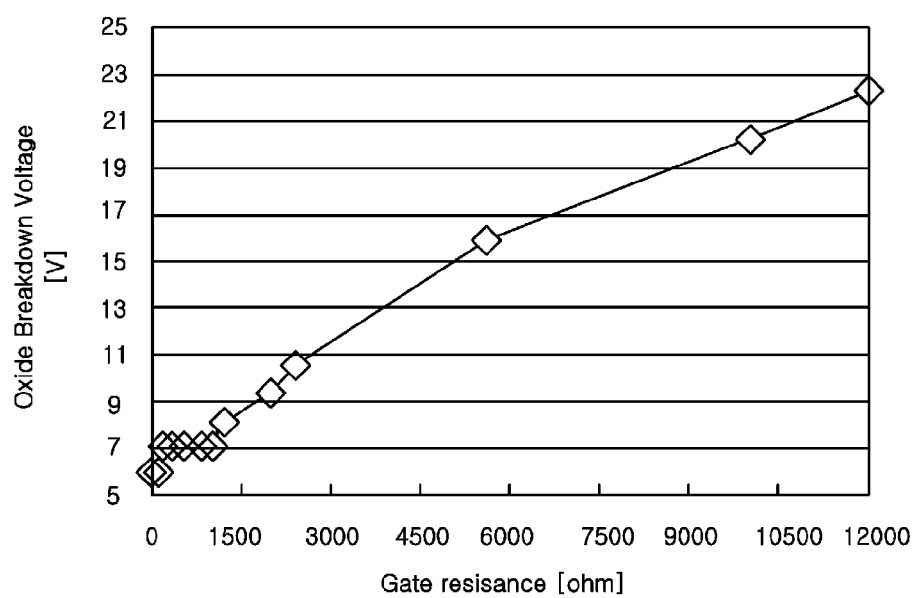
FIG. 13 is a graph illustrating a breakdown voltage of a gate insulating layer according to size of a gate protection region of an example.

FIG. 13 is a graph illustrating a breakdown voltage of a gate insulation layer according to a gate resistance value when transmission line pulsing (TLP) is applied to the gate with a 100 nsec duration. As illustrated in the example of FIG. 13, when a gate protection region connected to the semiconductor device of an example increases in gate resistance, the breakdown voltage of the gate insulating layer also increases accordingly. For example, oxide breakdown voltage increases according to increase of the gate resistance. Actual measurements illustrated in FIG. 13 include measuring an external resistor that is arranged on a gate front terminal of the semiconductor device. In such an example, the external resistor has an effect of controlling oxide breakdown voltage similar to that of adding the gate protection region during circuit layout. Additionally, the methods of controlling the resistance of a polysilicon gate include applying a non-silicide process, or a counter doping process, or a High-R resistor ion implantation process in order to cause a level shift semiconductor device's gate electrode. Also, a method of skipping ion implantation process to cause a higher resistance of the gate electrode is optionally applied. All processes that increase a resistance of the gate electrode and the gate protection region are included. For example, increasing a resistance of the gate region by including the gate electrode and the gate protection region as discussed protects the thin gate insulating layer 340 as well as the thick gate insulation layer 350 of the semiconductor device that is to be a protected device, through the above-mentioned processes.

Figure 14:
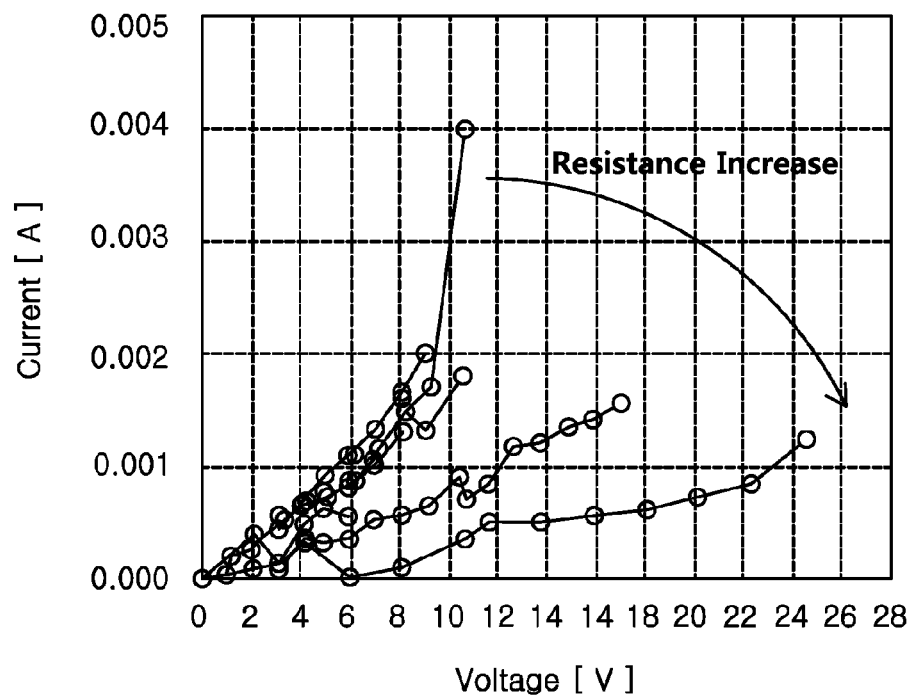
FIG. 14 is a graph illustrating a voltage-current applied to a gate of a semiconductor device of an example.

FIG. 14 illustrates a graph of TLP current-voltage of 100 nsec pulses according to a gate protection region of the semiconductor device. Gate resistance is progressively changed from 390 ohm to 12,000 ohm. Additionally, a current flowing through the gate electrode while increasing respective voltages corresponding to 390 ohm to 12,000 ohm are monitored. Consequently, the flowing current value decreases proportionately to the gate resistance. In other words, the ESD stress immunity capability of the semiconductor device increases according to an increasing gate resistance.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation, Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A semiconductor chip comprising:
a first input pad and a first ground pad located in a low voltage region on a semiconductor substrate;
a second input pad, and a second ground pad located in a high voltage region on the semiconductor substrate;
a first electrostatic discharge (ESD) clamp formed between the first input pad and the first ground pad; and
a level shifter comprising a semiconductor device and an ESD stress blocking region,
wherein the semiconductor device comprises a gate insulation layer having a thin gate insulation layer portion and a thick gate insulation layer portion, and a gate electrode formed over the gate insulation layer, and
wherein the ESD stress blocking region is electrically connected between the low voltage region and the gate electrode.

2. The semiconductor chip of claim 1, wherein the ESD stress blocking region comprises a non-silicided polysilicon layer.

3. The semiconductor chip of claim 1, further comprising:
a second ESD clamp connected between the second input pad and the second ground pad.

4. The semiconductor chip of claim 1, wherein
the ESD stress blocking region protects the semiconductor device from Charged Device Model (CDM) ESD stress that occurs near the semiconductor device.

5. The semiconductor chip of claim 1, wherein the ESD stress blocking region has a higher resistance than that of the gate electrode.

6. The semiconductor chip of claim 1, wherein the ESD stress blocking region is connected to the gate electrode of the semiconductor device.

7. The semiconductor chip of claim 1, wherein the first ESD clamp comprises a gate grounded N-channel Metal Oxide Semiconductor (NMOS).

8. The semiconductor chip of claim 1, further comprising:
a back-to-back diode located between the first ground pad and the second ground pad.

9. The semiconductor chip of claim 1, wherein the semiconductor device comprises an Extended Drain Metal Oxide Semiconductor (EDMOS) or a Laterally Diffused Metal Oxide Semiconductor (LDMOS); and
wherein the ESD stress blocking region is interconnected to the EDMOS or the LDMOS.

10. The semiconductor chip of claim 1, further comprising:
a first path formed between the first input pad and the first ground pad; and
a second path formed between the first input pad and the second ground pad,
wherein the second path has higher resistance than the first path.

11. A semiconductor chip comprising:
a semiconductor substrate, comprising a first input pad and a first ground pad located in a low voltage region of the semiconductor substrate and a second input pad and a second ground pad located in a high voltage region of the semiconductor substrate;
a first electrostatic discharge (ESD) clamp located between the first input pad and the first ground pad; and
a level shifter comprising a semiconductor device comprising a gate insulator, comprising a thin gate insulation layer and a thick gate insulation layer, and a gate electrode formed over the gate insulator, and an ESD stress blocking region disposed between the low voltage region and the gate electrode.

12. The semiconductor chip of claim 11, further comprising:
a second ESD clamp connected between the second input pad and the second ground pad.

13. The semiconductor chip of claim 11, wherein the ESD stress blocking region has a higher resistance than that of the gate electrode.

14. The semiconductor chip of claim 11, wherein the first ESD clamp comprises a gate grounded N-channel Metal Oxide Semiconductor (NMOS).

15. The semiconductor chip of claim 11, wherein the semiconductor device comprises an Extended Drain Metal Oxide Semiconductor (EDMOS) or a Laterally Diffused Metal Oxide Semiconductor (LDMOS); and
wherein the ESD stress blocking region is interconnected to the EDMOS or the LDMOS.

16. The semiconductor chip of claim 11, wherein the ESD stress blocking region is disposed between the low voltage region and the level shifter.

17. A semiconductor chip comprising:
a first input pad and a first ground pad located in a low voltage region on a semiconductor substrate;
a second input pad, and a second ground pad located in a high voltage region on the semiconductor substrate;
a first electrostatic discharge (ESD) clamp formed between the first input pad and the first ground pad; and
a level shifter comprising a semiconductor device and an ESD stress blocking region,
wherein the semiconductor device comprises a gate insulation layer having a thin gate insulation layer portion and a thick gate insulation layer portion, and a gate electrode formed over the gate insulation layer, and
wherein the ESD stress blocking region is directly electrically connected to the gate electrode.

* * * * *